United States Patent
Hauer et al.

[11] Patent Number: 6,125,043
[45] Date of Patent: Sep. 26, 2000

[54] CIRCUIT BOARD ARRANGEMENT WITH ACCURATELY POSITIONED COMPONENTS MOUNTED THEREON

[75] Inventors: Heiner Hauer, Fellbach; Albrecht Kuke, Auenwald; Eberhard Moess, Murrhardt; Werner Scholz, Weissach, all of Germany

[73] Assignee: Robert Bosch GmbH, Stuttgart, Germany

[21] Appl. No.: 09/153,796

[22] Filed: Sep. 15, 1998

[30] Foreign Application Priority Data

Nov. 12, 1997 [DE] Germany .......................... 197 50 073

[51] Int. Cl.$^7$ .................................................. H01L 23/498
[52] U.S. Cl. ......................... 361/760; 361/767; 361/777; 257/99; 257/737; 257/738; 257/778; 257/779; 257/780; 174/257; 174/260; 174/261; 29/834; 29/840; 228/180.21; 228/180.22; 438/108; 438/975
[58] Field of Search ..................................... 361/760, 767, 361/768, 777, 782, 783; 257/99, 737, 738, 778, 779, 780; 174/257, 260, 261, 138 G; 29/834, 840; 228/180.21, 180.22; 438/108, 975, 613, 614, 652, 654, 973

[56] References Cited

U.S. PATENT DOCUMENTS

| 3,436,615 | 4/1969 | Finlayson | 438/613 |
|---|---|---|---|
| 3,811,186 | 5/1974 | Larnerd et al. | 29/840 |
| 4,184,043 | 1/1980 | Hildering | 174/260 |
| 5,011,066 | 4/1991 | Thompson | 228/180.21 |
| 5,220,200 | 6/1993 | Blanton | 257/778 |
| 5,311,399 | 5/1994 | Zell et al. | 361/767 |
| 5,519,580 | 5/1996 | Natarajan et al. | 361/767 |
| 5,889,326 | 3/1999 | Tanaka | 257/737 |
| 5,929,521 | 7/1999 | Wark et al. | 257/737 |
| 5,968,670 | 10/1999 | Brofman et al. | 228/180.22 |

FOREIGN PATENT DOCUMENTS

| 0 248 566 A2 | 12/1987 | European Pat. Off. . |
|---|---|---|
| 0 312 217 A1 | 4/1989 | European Pat. Off. . |
| 0 669 931 A1 | 3/1996 | European Pat. Off. . |

OTHER PUBLICATIONS

"Stand–Offd for Chip Alignment as well as Controlled Collapse in Chip Joining", by A.F. Galloway, K.R. Grebe and C.Y. Ting, IBM Technical Disclosure Bulletin, vol. 23, No. 5, Oct. 1980, pp. 2156–2158.

"Chip Mounting with Orestretched Joints", by V.D. Coombs, IBM Technical Disclosure Bulletin, vol. 16, No. 3, Aug. 1973, p. 767.

Primary Examiner—Leo P. Picard
Assistant Examiner—John B. Vigushin
Attorney, Agent, or Firm—Michael J. Striker

[57] ABSTRACT

The circuit board (1) has a component (101) mounted on it by means of a soldering process which causes an automatic, passive alignment of the component (101) due to the surface tension in a melted piece of solder which electrically connects two pads (2, 102), one (102) of which is on the component and the other (2) of which is on the circuit board. Stand-offs (20) are used to provide a suitable spacing or distance between the component (101) and the circuit board (1). The other pad (2) has a surface that is divided into a central part (3) and an edge part (4), both wettable by the solder. The second or edge part (4) is shaped like a ring and surrounds the central part and is composed so that it is more slowly wettable by the solder than the central part. The spacing established by the stand-offs is dimensioned so that a melted piece of the solder between the pads produces a force drawing the component (101) toward the circuit board (1) because of surface tension in the melted solder.

16 Claims, 6 Drawing Sheets

CIRCUIT BOARD ARRANGEMENT WITH ACCURATELY POSITIONED COMPONENTS MOUNTED THEREON

BACKGROUND OF THE INVENTION

1. Field of the Invention

The present invention relates to a circuit board arrangement on which at least one component is mounted and, more particularly, to a circuit board arrangement having at least one component assembled or mounted thereon by means of a method using solder to align the at least one component as well as electrical connect it.

2. Prior Art

Circuit boards are known on which a component is soldered with the help of a method which causes an automatic, passive alignment of the component on the circuit board with the help of surface tension of the melted or liquified solder that simultaneously makes electrical contact with a pad of the component and a pad on the circuit board. An appropriate spacing is maintained between the circuit board and the component by stand-offs extending between the component and the circuit board.

The so-called flip-chip solder engineering method is known and used for high precision assembly of electronic and electro-optic components on circuit boards. In this method pads are produced on appropriate surfaces on the circuit board and the component that are wettable with solder. These pads permit mechanical attachment as well as electrical contact. The pads are surrounded by a peripheral layer that is not wettable by the solder. A so-called solder bump is placed on the pad either on the circuit board or on the component. The bumps are usually deposited with a thickness of around 20 to 30 µm either in a vacuum or a galvanic process. They are cylindrically structured with the help of a lacquer layer that has a thickness approximately equal to the bump height. A so-called under-plating metallization is required in galvanic deposition in order to guarantee electrical contact during the galvanic process. The thick lacquer layer and the under-plating metallization are removed in the region beyond the bumps. The cylindrical bumps are melted and take the form of a conical section as a result of the surface tension of the liquified solder and maintain that form on solidification. The base surface of a melted bump is defined by its footprint pad, which may be structured with substantially smaller tolerances than the solder bump structured with a thick lacquer layer prior to melting.

The component is pre-positioned on its mounted surface on the circuit board during assembly so that the bumps are in contact with the appropriate pads of the component. The bumps are exactly aligned on the pad by surface tension forces in the melted solder and lateral positioning errors which occur during mounting are thus automatically corrected. Because of that the lateral position of the component is close to the high precision position of the pad made during the masking process on the component or the circuit board. Simultaneously the electrical connections are made by means of the bumps. This known alignment process known according to the state of the art as "self-alignment" is, for example, shown in FIGS. 3A to 3G of European Patent Application EP 0 699 931 A1.

For electro-optical components, especially for laser diodes, an exact vertical positioning is also required as well as an exact later positioning in order to achieve a stable coupling to an optical fiber or image forming optics. The vertical position that the component mounted with the bumps takes is a balance between the surface tension forces of the liquid solder and the weight of the solder and component, wherein the volume of the individual bump, the pad surface area and the surface tension properties of the liquid solder and the pad surfaces enter as parameters. These variables are altogether difficult to control so that substantially greater errors enter into the vertical positioning than the lateral positioning.

An attempt to solve these problems has been made in the prior art by providing non-melting stand-offs of a predetermined height besides the bump on one of the supporting surfaces on the circuit board or the component or the bumps project into a cavity or depression with a predetermined depth. After melting and solidification of the bump, its height is reduced because of the change in its form from a spherical segment to a spherical zone so that the component is mounted on the stand-off or on the edge of the cavity and permits an exact predetermined height adjustment (see European Patent EP 0 312 217 A1, IBM Technical Disclosure Bulletin, Vol. 16, No. 3, August 1973, p. 767, IBM Technical Disclosure Bulletin, Vol. 23, No. 5, October 1980, pp. 2156 to 2158, EP 0 248 566 A2).

During this height adjustment it is however disadvantageous that the lateral position correction by the peripheral surface of the pad and the surface tension of the solder and the vertical positioning by lowering of the component and its placing on the stand-off or on the edge of the depression occurs simultaneously. The placing or mounting of the component is completed before lateral justification or correction, so that no further lateral motion can occur because of the static friction on the stand-off or on the edge of the depression, and the component does not achieve its best or optimum position. The height adjustment is of course improved but the lateral positioning is made poorer in contrast to the above-described method without the height stop or motion limit. Thus according to the state of the art additional mechanical guides are provided in the above-cited paper, which define the lateral position during the vertical motion. These lateral guides may however be made only with comparatively great effort or expense to the required accuracy specifications. The lateral positioning is achieved by the lateral guide elements and not by the simple and precise pad to be structured.

SUMMARY OF THE INVENTION

It is an object of the present invention to provide an improved circuit board arrangement that does not have the above-described disadvantages.

According to the invention a circuit board arrangement comprising
  a component having a pad;
  a circuit board on which the component is mounted and having another pad electrically connected to the pad on the component;
  stand-offs between the component and the circuit board for holding the component at a predetermined distance from the circuit board; and
  a portion of solder extending between the component and circuit board and acting to provide an automatic passive alignment of the component on the circuit board and to provide an electrical connection between the pad on the component and the other pad on the circuit board.

The electrical connection between the pads is made and the automatic passive alignment occurs by a method including the steps of:
  dividing a contacting surface of the portion of the solder contacting the other pad on the circuit board into a central zone and at least one peripheral edge zone;

alloying the solder in the central zone more strongly with a material in a center part of the other pad on the circuit board than the solder in the at least one peripheral edge zone; and melting the portion of the solder extending between the pads to form a melted piece of the solder, allowing the melted piece to solidify and selecting the dimensions of the stand-offs so that the component is drawn to rest on the stand-offs on the circuit board and the automatic passive alignment of the component is provided by action of surface tension in the melted piece of the solder during solidification of the melted piece.

The circuit board arrangement according to the invention avoids the above-described disadvantages and automatically allows both optimum lateral and also optimum vertical positioning. Both the lateral and also the vertical positioning is provided by the device according to the invention so that no additional lateral guide elements are required.

Advantageous further embodiments are set forth in the appended dependent claims whose features may be combined with each other in a meaningful manner.

BRIEF DESCRIPTION OF THE DRAWING

The objects, features and advantages of the invention will now be illustrated in more detail with the aid of the following description of the preferred embodiments, with reference to the accompanying figures in which.

DESCRIPTION OF THE PREFERRED EMBODIMENTS

The same reference number is used for the same parts when the same parts appear in different figures.

Figure 1:
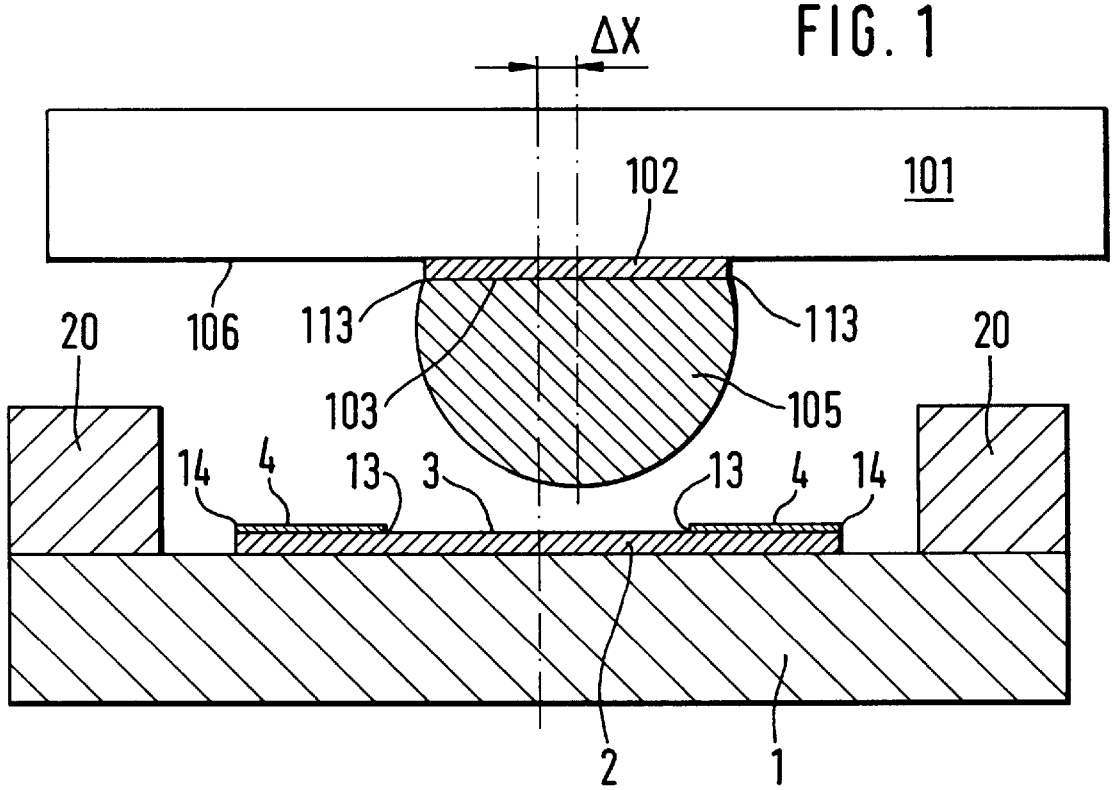
FIG. 1 is a side view of a circuit board with a component mounted on it.

FIG. 1 shows a circuit board 1 and a component 101 held over it. A number of metal pads 2 are arranged on the circuit board 1 and an equal number of metal pads are arranged in corresponding positions on the component 101. Only one pad is shown in the illustration for improved ease of understanding. The positions of the pad centers of the circuit board and the component are displaced by a lateral error ΔX on account a positioning error of the holding tools (not shown). The pad 102 has a surface 103 that is wettable by solder, which is surrounded by a peripheral edge 113; the surface 106 of the component 101 outside of the peripheral edge 113 is not wettable by solder. A melted spherical segment-shaped solder bump 105 sits on the pad 102. The position of this solder bump is defined by the periphery line 113. The peripheral edge 113 can, as is known in the state of the art, either, as shown in FIG. 1, be made so that the metallic and solder-wettable layer ends at its peripheral edge and the surface 106 is not wettable, or it can be made so that a non-wettable layer is first applied to the component surface 106 and the pad surface and then that layer is removed in the vicinity of the pad whose edge 113 bounds the wettable pad surface 103.

The pad surface is divided into two surface portions on at least one of the two corresponding pads (in FIG. 1 the pad 2 on the circuit board 1 is selected). The central part 3 provided with peripheral boundary line 13 is immediately wettable by solder and the edge part 4 surrounding it provided with peripheral boundary line 14 is wettable with solder only after some delay. Both surface portions 3 and 4 or peripheral boundary lines 13 and 14 are arranged concentric with each other, i.e. their centers of mass or gravity coincide.

Figure 2:
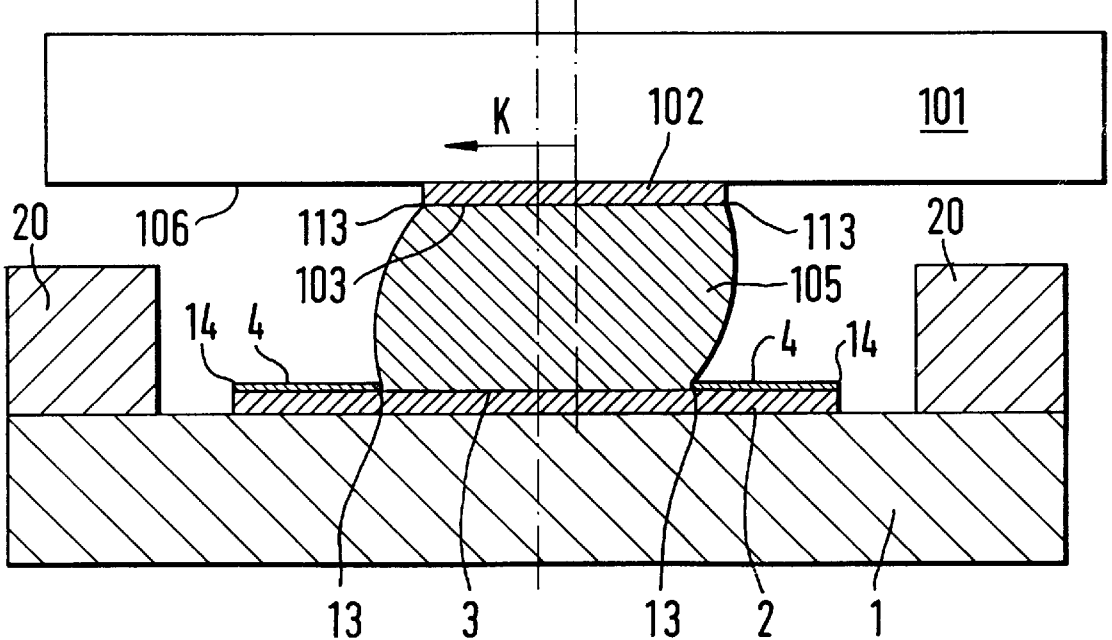
FIG. 2 is a side view of the arrangement in FIG. 1 with the component partially lowered.
Figure 3:
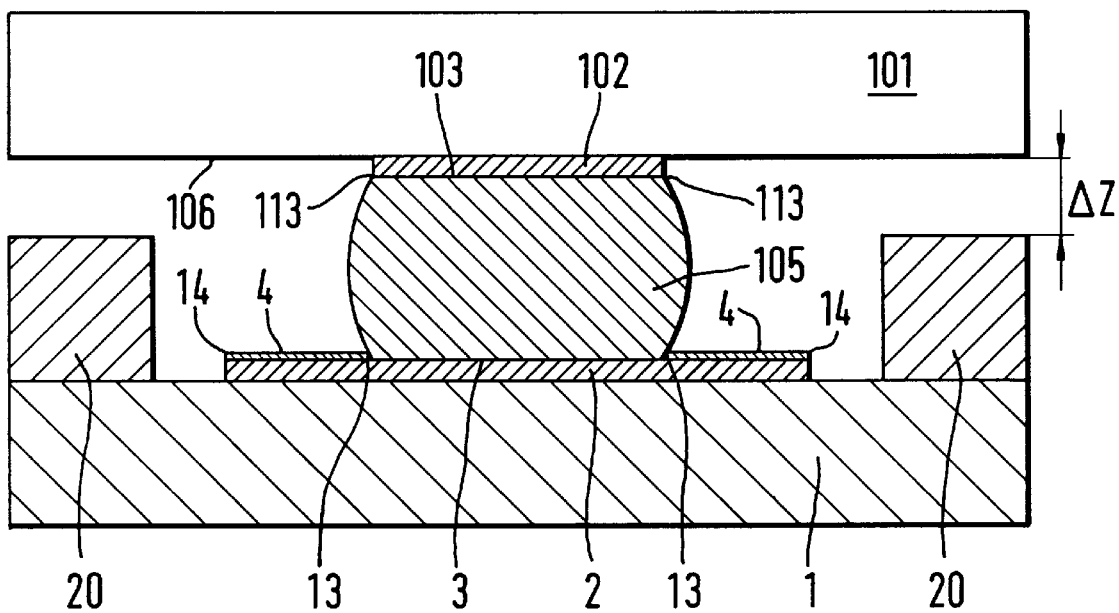
FIG. 3 is a side view of the arrangement in FIG. 1 after automatic correction of the lateral position error.
Figure 4:
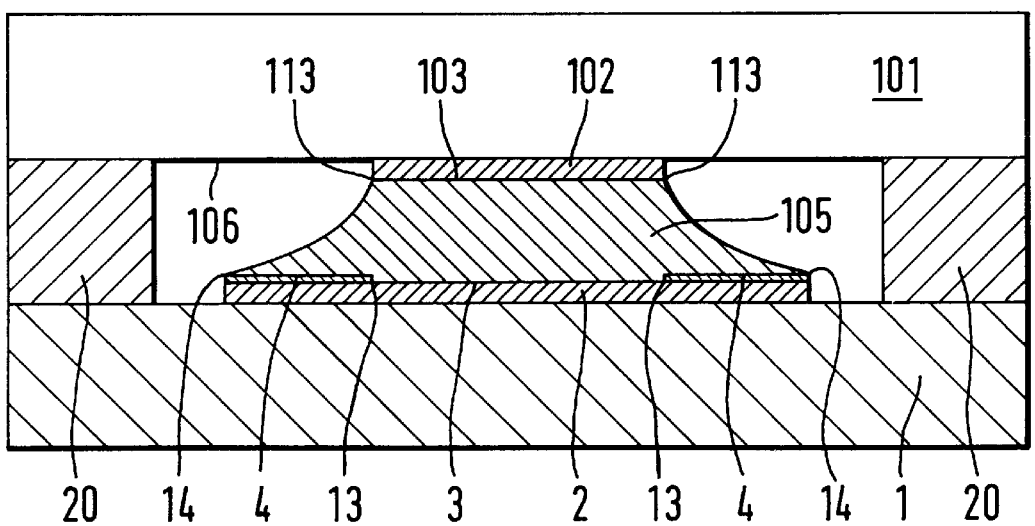
FIG. 4 is a side view of the a circuit board with a component mounted on it as in FIG. 1, in which the still liquified or already solid solder connecting the electrical pads with each other is approximately in the apparent form of the bell of a trumpet (like a half of a folded or broken hyperboloid)

FIG. 2 shows the bump configuration after placing the bump 105 on the immediately wettable central part 3. The solder wets the central part and exerts a transverse force K on account of the starting displacement or error ΔX of the assembly tool originating from the surface tension, which centers the displaced and now freely movable chip. The center position is shown in FIG. 3. After a certain time also the edge layer or surface portion 4 is wettable by the solder so that the solder can spread out until at the peripheral edge 14 of the edge layer 4. Since the solder volume must remain constant the bump height must decrease. Because of that the component is lowered by an amount ΔZ until it rests on the stand-offs 20. The height of the stand-offs determine the vertical position of the component. Thus a horizontal and vertical self-adjustment is possible without mutual damage or impairment in the working process. As a boundary condition one must consider that the lowering ΔZ0 because of base surface expansion or enlargement which would occur without the stand-offs is greater than the displacement ΔZ that takes place with the stand-offs present. The surface tension of the solder then exerts a vertical pulling force, with which the component is drawn against its supports, whereby a reliable vertical positioning is achieved. During solidification of the solder during the cooling process this pulling force is increased even more, when the thermal expansion coefficient of the stand-off is smaller than that of the solder, which is the usual situation for most materials used in this arrangement. The vertical pulling force is limited by the plastic deformability of the solder to the extent that fracture or tearing of the solder or damage of the structural element should be avoided. The fixed pulling force can be limited, especially with hard solder, for example with Au/Sn solder, when the thermal expansion coefficient of the stand-off is only slightly less than that of the solder.

Figure 5:
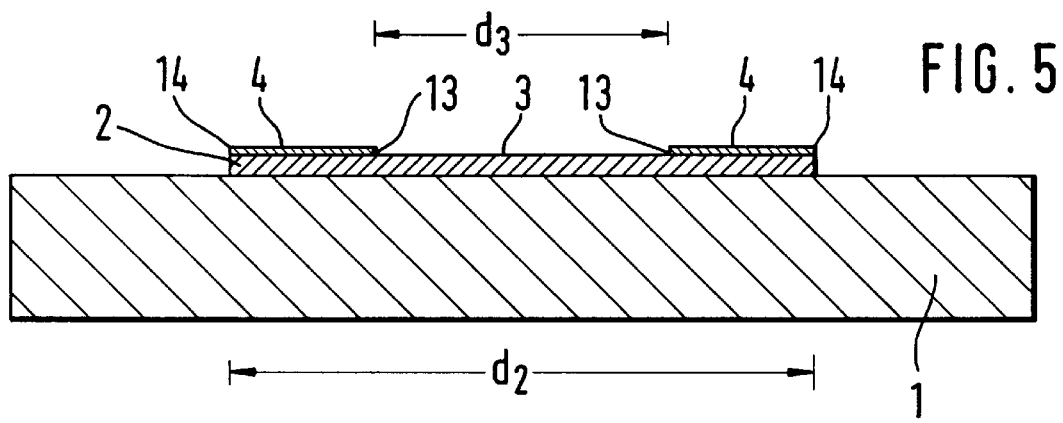
FIG. 5 is a side view of a circuit board with a pad which is prepared for the bumping process.
Figure 6:
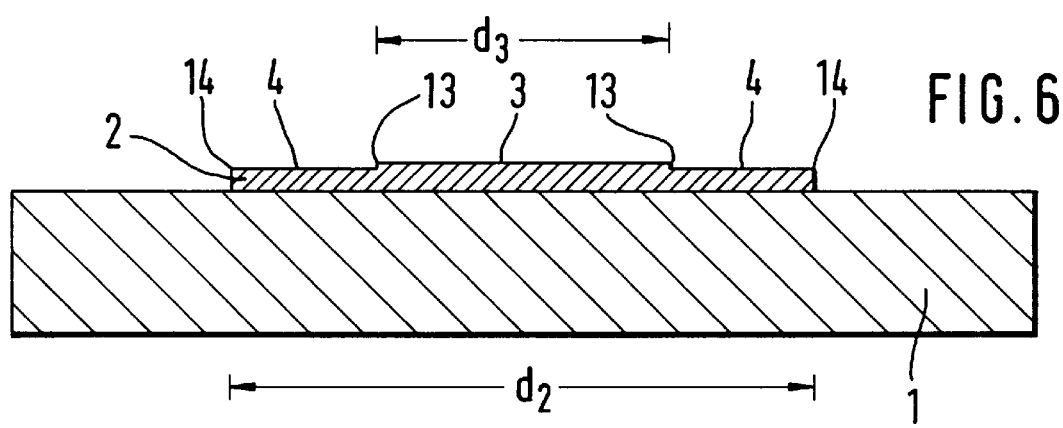
FIG. 6 is a side view of a circuit board with a pad, which is prepared in another manner for the bumping process.
Figure 7:
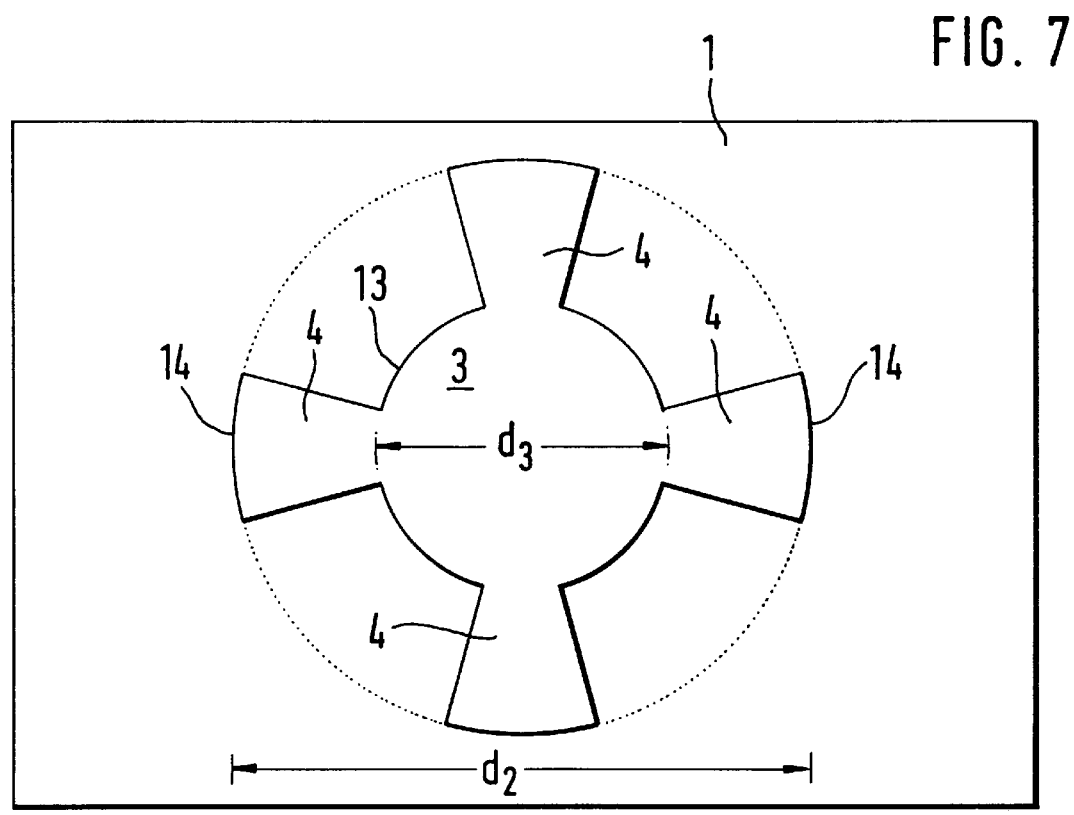
FIG. 7 is a top view of a circuit board with a pad, which has an allowed form of its second partial surface (edge zone) connecting to the central partial surface.

A few features for making the surface portions on the edge region of a pad so that it is wettable after a certain predetermined delay are explained in the following. FIGS. 5 to 7 illustrate the pad structure according to the invention with the edge parts that are wettable with a predetermined delay on the circuit board and without a bump placed on it. Similarly this structure can be provided on the component or built on the bump. The features described in FIGS. 8a to 8h must be considered only for the case that the bump is deposited electrochemically by a throughgoing underplating-metallized layer.

FIG. 5 shows a gold layer 2 on a circuit board 1, that is structured photolithographically to form a pad with a diameter d2. A nickel layer 4 was deposited on this gold layer, in which an opening 3 with a diameter d3 was structured in a center portion above the gold layer. A solder bump made from a gold-tin alloy having a eutectic composition is used in the bumping process. The solder pump is brought into contact with the gold layer in the opening 3. On melting the liquid solder only wets the exposed Au layer up to the peripheral edge 13 of the opening. The nickel alloys with the Au/Sn solder during the further operation of the method and dissolves in it. Also the edge part 4 is wet up to its peripheral edge 14 and because of that reduces the pump height according to the invention and lowers the component onto the stand-offs (not shown in this illustration). The delay in the wetting of the edge part may be adjusted by means of the thickness of the nickel layer.

One possiblity for making an edge part that can be wet after a delay is shown in FIG. 6. Here a gold pad 2 with a diameter d2 is applied to a circuit board 1. This gold pad is thicker in its central part 3 with the diameter d3 than in its edge part 4. In the bumping process the solder bump is brought into contact only with the thicker central part 3. There the fluid solder wets the gold surface after melting. Experience with Au/Sn bumps on Au pads shows that the solder wetting occurs only up to the perpendicular edge on the periphery of the gold pad. A finite dihedral angle of the solder to the horizontal pad surface is formed as a result of the surface tension of the liquid solder on the gold. This angle which opposes the balancing of the surface tension forces must drop to zero at the perpendicular edge 13 on the periphery of the thicker central surface region 3. Because of that a further wetting is prevented. Next the gold in the thicker central part 3 is alloyed in the solder to the extent that the perpendicular step at the edge 13 vanishes so that the solder can also wet the edge zone 4 to its peripheral boundary 14. The delayed wetting required according to the invention can be achieved by this mechanism. The duration of the delay may be adjusted as required or according to the specifications by selection of the step height at the edge 13.

A further possibility for delayed wetting of the edge part is shown in FIG. 7. Projections 4 extend from the central part 3 with an interrupted peripheral boundary line 13 forming a broken edge part extending up to its peripheral boundary 14 in a star-like arrangement, preferably symmetric to the center of the central part 3. The central part 4 and the edge part 3 can both be made from the same material with the same thickness in contrast to the previous suggestions. The solder wetting first the central part 3 spreads next until at its boundary line or peripheral edge 13. The wetting by the solder is delayed because of the cross-sectional reduction at the transition to the edge part 4. The duration of the delay may be adjusted to the requirements of the bump lowering by the geometry of the projections 4. Other forms of the projections 4 than are shown in FIG. 7 are possible. For example, the projections in the outer surface portion can have island-like recesses arise in the edge region or the edge region can be covered with perforations at the same time.

The surface edge part wettable with a delay according to the invention can be applied on the pad opposite and not covered by the bump and also on the footprint pad under the bump. In the second case the manufacturing method of the bump need not be considered.

If the bump is assembled in a vacuum layer process, no underplating-metallization layer is required and three of the above-described delaying mechanisms can be used as with the bumpless pad. It should be noted that the bump is only assembled over the central part of the pad and its diameter is smaller or at most equally large as the diameter d3 of the central part 3. This is true when the bump is made by currentless galvanic deposition.

An underplating-metallization layer is required to mask the bump by electron-galvanic methods. Because of that the footprint pad is contacted cathodically. Also a method of making an edge part that is wettable with a predetermined delay is suggested for this case. The process steps for that are shown in FIGS. 8a to 8h. The illustration shows the structure of the bump on the circuit board, for example silicon. Also a bump may be made on a component in the same way. For simplicity the making of an individual bump only is shown in the figures and the stand-offs are not shown (See FIGS. 1 to 3).

Figure 8A:
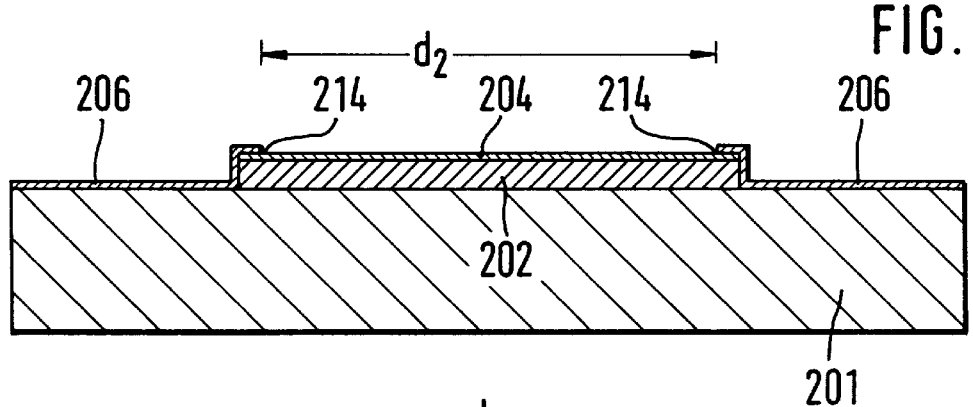
FIGS. 8a to 8h are respective side views illustrating a method according to the invention for making a connection between a pad on a circuit board and a pad on a component by soldering.
Figure 8B:
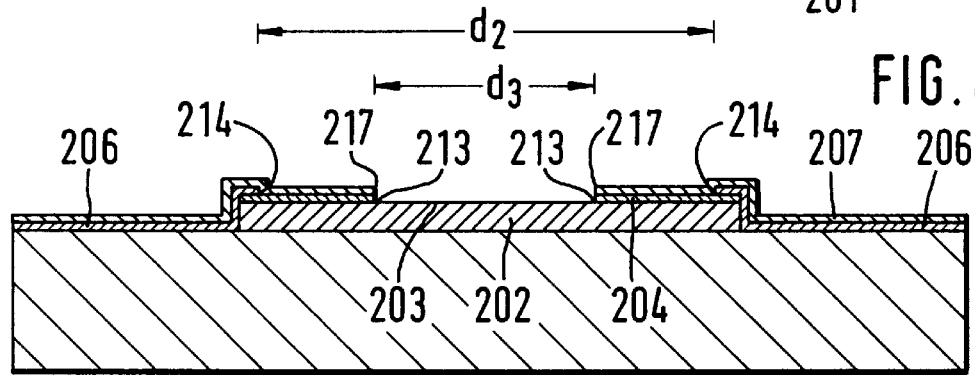

FIG. 8a shows a circuit board 201 that can be made from silicon or also another commercially available material, for example aluminum oxide ceramic material. A contacting layer 202 and a delay layer 204 are assembled by an unshown adhesive layer according to the state of the art on this circuit board. Both layers 202 and 204 are photolithographically structured jointly so that a footprint pad is produced. A solder-stop layer 206 is applied after the structuring. This layer can be produced by structuring the circuit board, for example comprising polyimide. The silicone nitride layer required for passivization can serve in the structuring of the bump on the component. The solder-stop layer is photolithographically etched over the pad surface. The peripheral edge 214 arises which results in the boundary of the edge part 204 with a diameter d2 that is wet with the solder after a predetermined delay. This structuring can be performed with a very high precision because of the reduced thickness of the solder stop layer.

A TiW layer 207 is applied as an adhesive layer for an underplating-metallization layer by this structuring. This adhesive layer 207 is etched over the central region 203 of the pad so that the peripheral edge part 217 arises. The delay layer 207 is etched off the central part 203 of the pad within this peripheral edge part, so that the easily wettable gold layer is exposed there(see FIG. 8b). This central part 203 with the diameter d3 is surrounded by the peripheral edge part 213 that can be structured with a high precision, which later causes the lateral positioning of the bump.

Figure 8C:
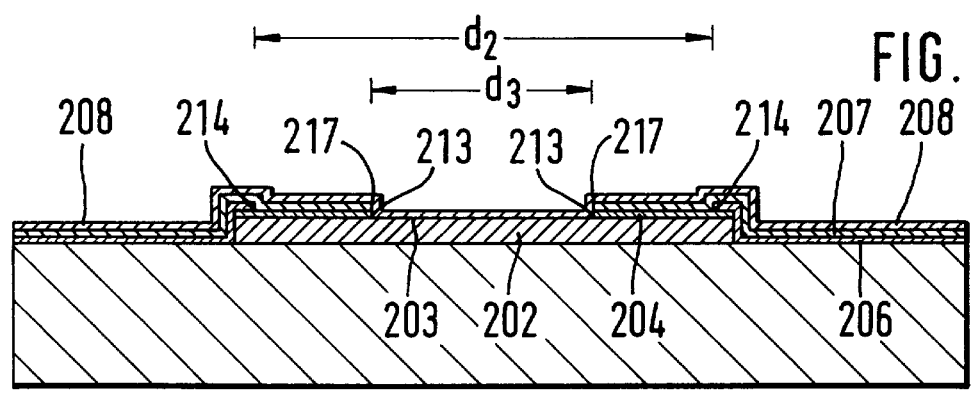

An additional gold layer 208 that serves as underplating-metallization layer for the electro-galvanic process is applied by this structuring (FIG. 8c). The TiW acts as adhesive layer for this gold layer 208 outside of the pad central part. The adherence occurs directly on the gold in the central zone 203 inside the pad-central part.

Figure 8D:
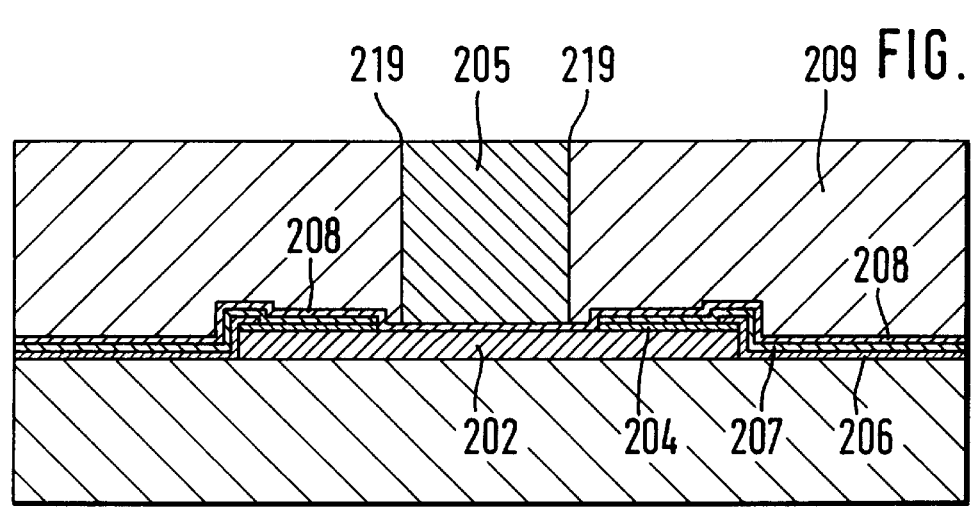

The structures are now surface coated over the entire surface with a thick resist 209, that is structured open in the region 219—219 for the bump to be built there. The exposed region 219—219 is inside of the peripheral boundary line 213—213 of the central part 203 (FIG. 8d). The thick resist layer 209 permits a photolithographic structuring that is not as exact as thin metal and adherent layers. In FIG. 8d this is indicated because the region 219—219 is not exactly centered relative to the opening 213—213 and is somewhat displaced from it. This displacement is automatically corrected in additional process steps as a result of lateral self-adjusting effects.

Figure 8E:
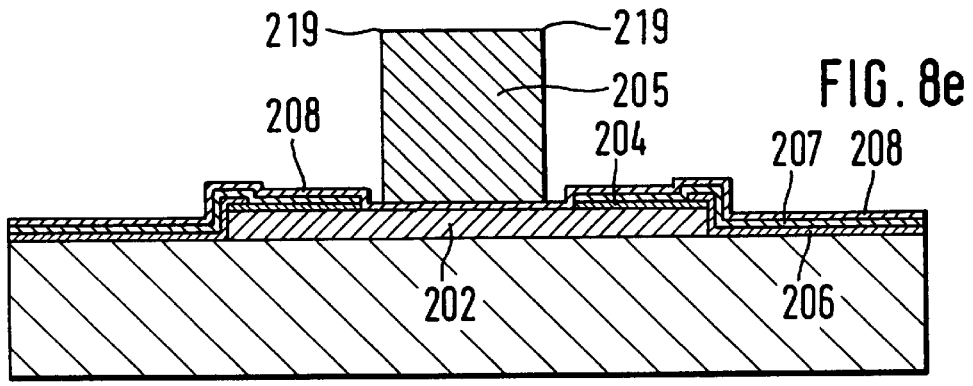
Figure 8F:
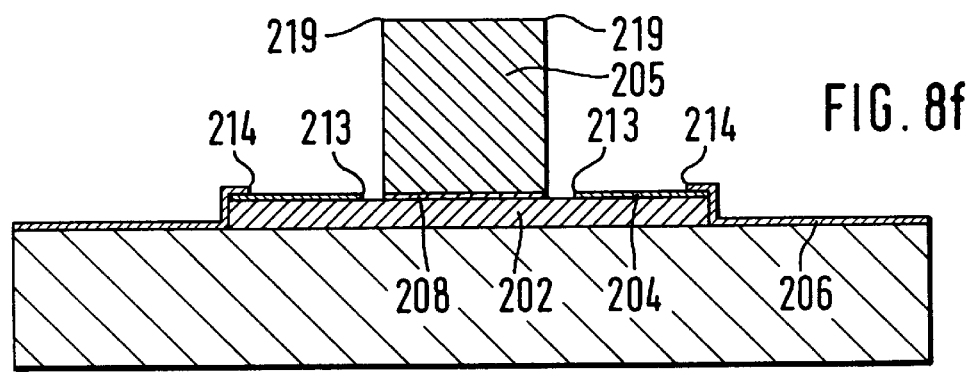
Figure 8G:
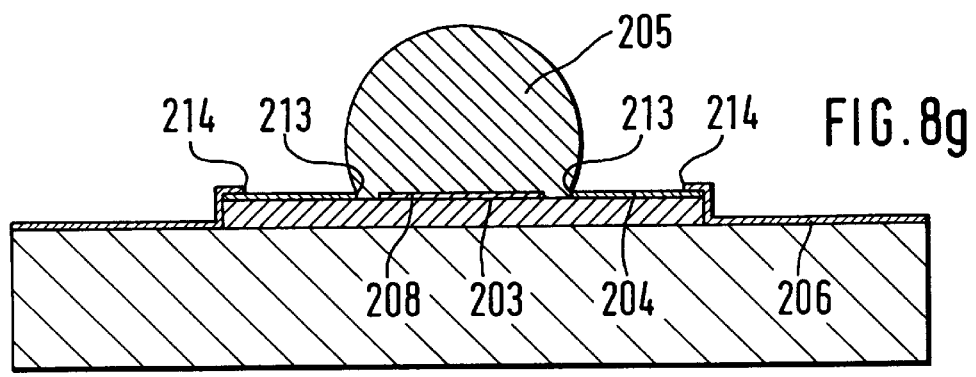
Figure 8H:
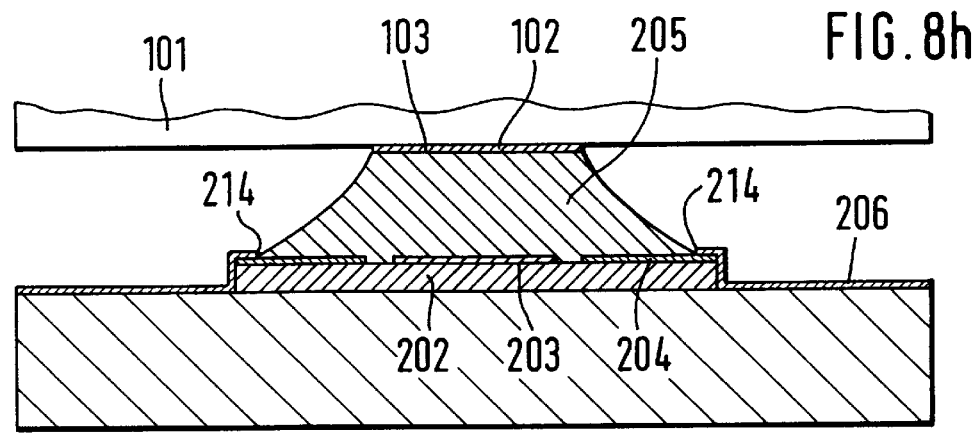

After the galvanic structuring of the bump 205 the galvanic resist 209 is removed (FIG. 8e). Now a photolithographic structuring is no longer possible because of this process step, since application and illumination of a lacquer mask is prevented because of the height of the bump. The etching step required can occur over the entire surface. The gold layer 208 no exposed is removed by ethcing over the entire surface. The nickel layer 204 is protected by the TiW layer during the gold etching. Of course the gold surface layer 203 can be etched between the edge 217—217 of the TiW layer and the edge of the bump 219—219. The first gold layer 202 is however selected so that it is so thick that a small portion of removed material is insignificant. A little of the second gold layer 208 remains over the first gold layer 202 under the bump 205. Subsequently the TiW layer 207 is etched off the entire surface (FIG. 8f).

The cylindrical bump is now melted on (FIG. 8g), whereby it takes a spherical segment form. Thus the wetting occurs first up to edge 213—213 of the opening in the nickel layer 204. In the bumping process the component 103 is put into contact with the corresponding opposing pad 103. The nickel layer 204 is alloyed during further heating, so that the wetting occurs up to the edge 214—214 and the component, as described, is lowered and rests on the stand-offs or edge of a cavity or depression that receives the bump.

Figure 9A:
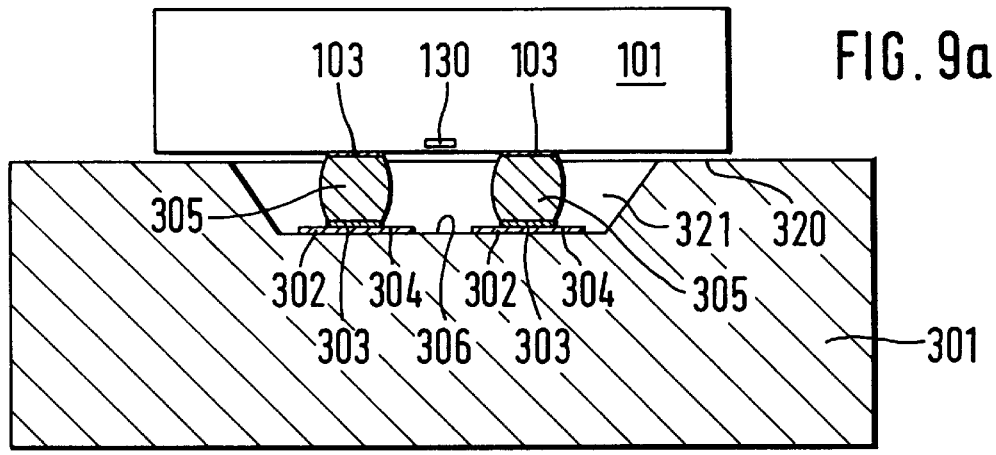
FIGS. 9a and 9b are diagrammatic side views of two stages in a process for making a soldered connection between two pads on a circuit board and two pads on an electro-optic component.
Figure 9B:
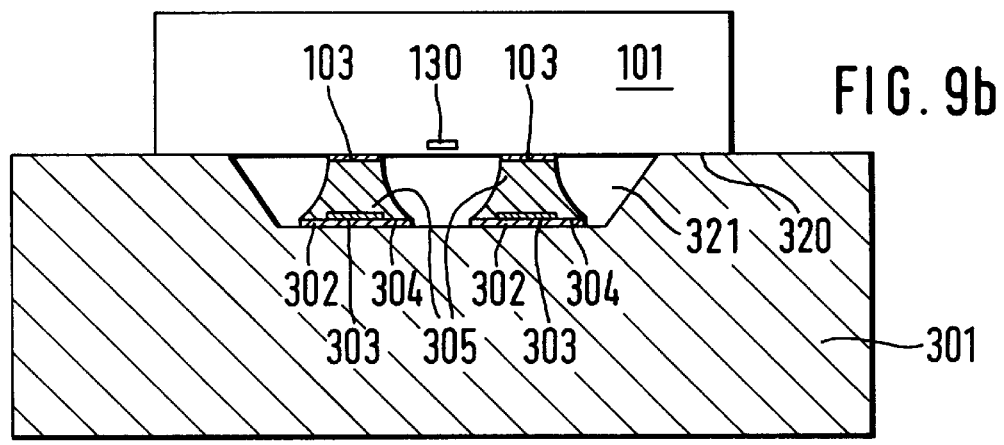
Figure 10:
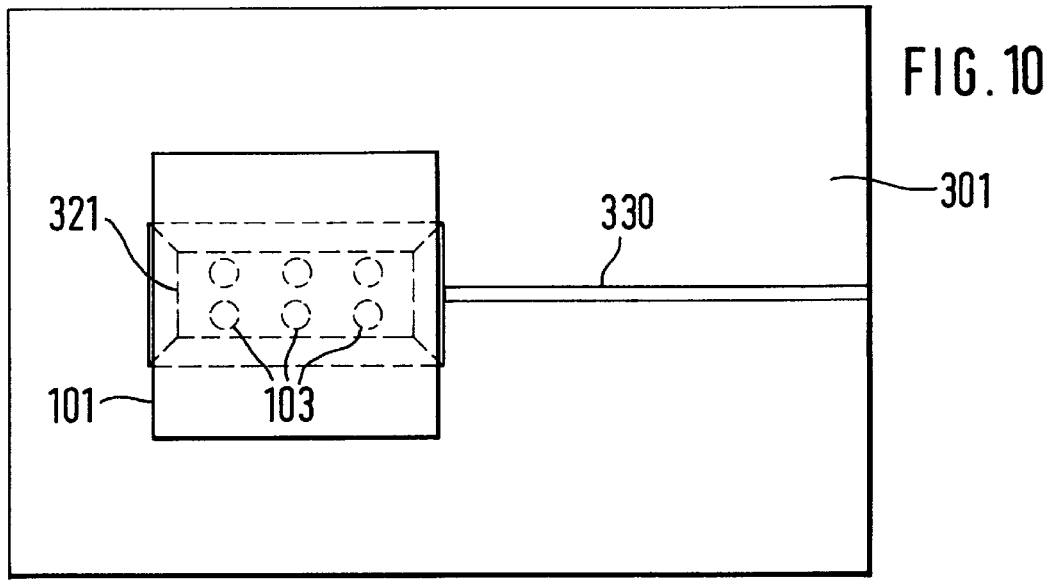
FIG. 10 is a plan view of a circuit board arrangement made according to the process of FIG. 9 that has a light guide which is aligned optically with the electro-optic component.

An additional embodiment is shown in FIGS. 9a, 9b and 9c. The lateral and vertical positioning by means of delayed wetting pads is used here in a circuit board 301 with a cavity 321 with a plane surface 302 for receiving the pads. The electro-optic component, for example a laser diode, has a light outlet surface 130 that is aligned with a light wave guide 330 on the circuit board 301 (FIG. 10). The light wave guide can either be a strip wave guide mounted on the circuit board or a fiber arranged in a V-groove. The V-groove for example can be made by etching a silicon substrate. In the bumping process the component 101 aligns the solder bump 305 by means of the pad surfaces 103 and 303 (FIG. 9a). After wetting the delayed wetting edge parts 304 the component lowers until it contacts on the upper edge surface region 320 of the circuit board 301. The top edge surface region 320 takes over the function of the stand-offs 20 in the embodiment of FIGS. 1 to 3. The depth of the cavity 321 must thus have the precision of the required vertical final alignment, since this is determined by the vertical position of the radiating surface in the component or in the wave guide. The use of this type of depression or cavity 321 is of course already known for vertical positioning however the simultaneous lateral positioning by the delayed wetting surface according to the invention also provides the required positioning accuracy in lateral alignment.

The disclosure in German Patent Application 197 50 073.0 of Nov. 12, 1997 is incorporated here by reference. This German Patent Application describes the invention described hereinabove and claimed in the claims appended hereininbelow and provides the basis for a claim of priority for the instant invention under 35 U.S.C. 119.

While the invention has been illustrated and described as embodied in a circuit board arrangement with accurately positioned components mounted thereon, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

We claim:

1. A circuit board arrangement comprising
   a component (101) having a pad (102);
   a circuit board (1) on which said component (101) is mounted, said circuit board having another pad (2) electrically connected to said pad (102) on the component (101);
   stand-offs (20) between the component (101) and the circuit board (1) for holding said component (101) at a predetermined distance from said circuit board (1); and
   a portion (105) of solder extending between said component (101) and said circuit board (1) and acting to provide an automatic passive alignment of said component (101) on said circuit board and to provide an electrical connection between said pad (102) on said component and said another pad (2) on said circuit board;
   wherein said electrical connection between said pads is made and said automatic passive alignment occurs by a method including the steps of:
      dividing a contacting surface of said portion (105) of said solder contacting said another pad (2) on said circuit board (1) into a central zone and at least one peripheral edge zone;
      alloying said solder in said central zone more strongly with one material in a center part (3) of said another pad (2) contacting said solder than said solder in said at least one peripheral edge zone; and
      melting said portion (105) of said solder extending between said pads to form a melted piece of the solder, allowing the melted piece to solidify and selecting the dimensions of said stand-offs so that said component (101) is drawn to rest on said stand-offs (20) on said circuit board and said automatic passive alignment of said component is provided by action of surface tension in said melted piece of said solder during solidification of said melted piece.

2. The circuit board arrangement as defined in claim 1, wherein said method includes dividing a solder-contacting surface of said another pad (2) into the central part (3) and an edge part (4), controlling a composition of the edge part and the central part so that the edge part (4) is wettable more slowly by said solder than the central part (3) and alloying said solder in said at least one peripheral edge zone with another material in said edge part (4) contacting said solder to a greater extent than said solder in said central zone.

3. The circuit board arrangement as defined in claim 1, wherein said method includes dividing a solder-contacting surface of said another pad (2) into the central part (3) and at least one edge part (4) surrounding and adjoining said central part (3) in a continuous or broken ring, and the at least one edge part (4) includes a second material that is wettable more slowly by said solder than the central part (3) in contrast to the one material.

4. The circuit board arrangement as defined in claim 1, wherein the stand-offs (20) are attached to the circuit board (1).

5. The circuit board arrangement as defined in claim 1, wherein the stand-offs (20) have a thermal expansion coefficient that is less than that of the solder.

6. The circuit board arrangement as defined in claim 2, wherein said solder comprises a gold-tin alloy, said edge part (4) comprises nickel and said central part (3) comprises gold.

7. The circuit board arrangement as defined in claim 2, wherein the portion (105) of the solder contacts an area on said pad (102) of said component that is opposite to said central part (3) and is not greater in area than said central part (3).

8. The circuit board arrangement as defined in claim 7, wherein said area on said pad (102) and said central part (3) are circular and said area has a diameter that is not greater than a diameter of said central part (3).

9. The circuit board arrangement as defined in claim 1, wherein said portion (105) of said solder extending between said contacts is in the shape of a bell of a trumpet.

10. The circuit board arrangement as defined in claim 1, wherein a surface area of the portion (105) of solder contacting the another pad (2) of the circuit board (1) is larger than another surface area of the portion (105) of the solder contacting the pad (102) of the component (101) and is bounded by an edge (14) of said another pad (2).

11. The circuit board arrangement as defined in claim 1, wherein a surface area of the portion (105) of solder contacting the another pad (2) of the circuit board (1) is larger than another surface area of the portion of the solder contacting the pad (102) of the component (101) and is bounded by an edge (214) of a solder-stopping layer (206).

12. The circuit board arrangement as defined in claim 11, wherein the solder-stopping layer (206) comprises a polyimide.

13. The circuit board arrangement as defined in claim 11, wherein the solder-stopping layer (206) comprises a silicon nitride.

14. The circuit board arrangement as defined in claim 1, wherein the component (101) is an electro-optic component.

15. The circuit board arrangement as defined in claim 1, wherein said circuit board (1) is provided with a light wave guide (330) arranged on a side of said circuit board facing said component (101) and said light wave guide (330) is aligned with said component (101) on said circuit board (101).

16. The circuit board arrangement as defined in 1, wherein said circuit board (1) is provided with a depression or cavity (321) having a circumferential edge step (320) acting as said stand-offs and said another pad is located in said depression or cavity (321).

* * * * *